(12) United States Patent
Nishimura et al.

(10) Patent No.: US 11,502,647 B2
(45) Date of Patent: Nov. 15, 2022

(54) AMPLIFIER

(71) Applicant: SONY SEMICONDUCTOR SOLUTIONS CORPORATION, Kanagawa (JP)

(72) Inventors: Kazumasa Nishimura, Kanagawa (JP); Masahiro Ichihashi, Kanagawa (JP); Masayuki Katakura, Kanagawa (JP); Kenya Kondou, Kanagawa (JP); Tetsuya Tashiro, Kanagawa (JP); Boyang Hao, Kanagawa (JP); Kouzi Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/049,901

(22) PCT Filed: Feb. 8, 2019

(86) PCT No.: PCT/JP2019/004575
§ 371 (c)(1),
(2) Date: Oct. 22, 2020

(87) PCT Pub. No.: WO2019/215973
PCT Pub. Date: Nov. 14, 2019

(65) Prior Publication Data
US 2021/0242838 A1   Aug. 5, 2021

(30) Foreign Application Priority Data

May 11, 2018 (JP) .............................. JP2018-092058

(51) Int. Cl.
*H03F 1/22* (2006.01)
*H03F 3/187* (2006.01)
(Continued)

(52) U.S. Cl.
CPC ............. *H03F 1/223* (2013.01); *H03F 3/187* (2013.01); *H03F 1/301* (2013.01); *H03F 1/302* (2013.01);
(Continued)

(58) Field of Classification Search
CPC .... H03F 1/223; H03F 3/187; H03F 2200/429; H03F 2200/432; H03F 3/347; H03F 3/211; H04N 5/3577; H04N 5/378
(Continued)

(56) References Cited

U.S. PATENT DOCUMENTS

2004/0066234 A1*  4/2004  Luo ........................ H03F 1/30
                                                       330/296
2006/0244527 A1   11/2006  Tsuruya
2012/0119063 A1    5/2012  Takamiya et al.

FOREIGN PATENT DOCUMENTS

CN    102469276 A    5/2012
CN    107925731 A    4/2018
(Continued)

OTHER PUBLICATIONS

International Search Report and Written Opinion of PCT Application No. PCT/JP2019/004575, dated Apr. 23, 2019, 06 pages of ISRWO.

*Primary Examiner* — Samuel S Outten
*Assistant Examiner* — Khiem D Nguyen
(74) *Attorney, Agent, or Firm* — Chip Law Group

(57) ABSTRACT

Provided is an amplifier that includes a first transistor including a gate terminal to which an applied input signal is input, where a current depending on the applied input signal flows through the first transistor. A gate terminal of a second transistor is connected to a load section, and a current depending on a change in a voltage of the drain terminal of the first transistor flows through the second transistor. A
(Continued)

source terminal of the first transistor and a drain terminal of the second transistor are connected in common to a first resistance, and the current from the first transistor and the current from the second transistor flow through the first resistance. A third transistor supplies a current approximately equal to the current of the second transistor. The current supplied by the third transistor is output from an output end.

7 Claims, 7 Drawing Sheets

(51) Int. Cl.
   *H03F 3/72* (2006.01)
   *H03F 3/16* (2006.01)
   *H03F 1/30* (2006.01)

(52) U.S. Cl.
   CPC .................. *H03F 3/16* (2013.01); *H03F 3/72* (2013.01); *H03F 2200/18* (2013.01)

(58) Field of Classification Search
   USPC ......... 330/252–262, 308, 86, 282, 277, 285, 330/298
   See application file for complete search history.

(56) References Cited

FOREIGN PATENT DOCUMENTS

| | | |
|---|---|---|
| JP | 2009-303042 A | 12/2009 |
| JP | 2012-109658 A | 6/2012 |
| JP | 2018-019335 A | 2/2018 |
| WO | 2018/020858 A1 | 2/2018 |

* cited by examiner

AMPLIFIER

CROSS REFERENCE TO RELATED APPLICATIONS

This application is a U.S. National Phase of International Patent Application No. PCT/JP2019/004575 filed on Feb. 8, 2019, which claims priority benefit of Japanese Patent Application No. JP 2018-092058 filed in the Japan Patent Office on May 11, 2018. Each of the above-referenced applications is hereby incorporated herein by reference in its entirety.

TECHNICAL FIELD

The present disclosure relates to an amplifier. In particular, the present disclosure relates to an amplifier used to detect noise and the like.

BACKGROUND ART

Conventionally, an electronic apparatus is used that reduces an effect of noise. For example, an imaging device used in a camera and the like includes two-dimensionally arranged pixels each generating an image signal. When imaging is performed, many pixels each generate an image signal at the same time. Thus, there is an increase in load variation, and there is a variation in a power supply voltage of a power supply circuit that supplies power to the imaging device. When an image signal generated in a pixel is changed due to the variation in the power supply voltage, the image signal is contaminated by noise, and this results in a reduction in image quality. Thus, an imaging device is used that detects a variation in power supply voltage and compensates for a change in image signal on the basis of the detected variation in power supply voltage.

It is possible to perform the compensation for a change in image signal upon performing an analog-to-digital conversion that converts an image signal output from a pixel into a digital image signal. For example, a variation in power supply voltage is detected using an amplifier that is connected to the above-described power supply through a coupling capacitor, and a reference signal used to perform an analog-to-digital conversion is adjusted according to the detected variation in power supply voltage. An imaging device has been proposed that performs such processing to eliminate an effect of a variation in power supply voltage (for example, refer to Patent Literature 1).

CITATION LIST

Patent Literature

Patent Literature 1: Japanese Patent Application Laid-open No. 2018-019335

DISCLOSURE OF INVENTION

Technical Problem

In the case of the amplifier that is disclosed in the related art described above and detects a variation in power supply voltage, an amount of variation in power supply voltage is applied to a gate of a MOS transistor as an input signal. A constant current circuit is connected to a drain terminal of the MOS transistor to supply a drain current. Current corresponding to a difference between the drain current based on the input signal amplified by the MOS transistor and the current supplied by the constant current circuit, is output through a current mirror circuit. This output current is a signal (output current) obtained by detecting the variation in power supply voltage that is the input signal. In the related art described above, the variation in power supply voltage is compensated for by adjusting a waveform of a reference signal according to the output current.

However, the related art described above has a problem in which there is a difficulty in gain adjustment since a gain when an input signal is amplified in an amplifier depends on a mutual conductance (gm) of a MOS transistor. Thus, there is a problem in which a reference signal is not sufficiently adjusted and thus an image signal is greatly affected by noise.

The present disclosure has been achieved in view of the problems described above, and it is an object of the present disclosure to easily adjust a gain of an amplifier.

Solution to Problem

The present disclosure has been achieved to solve the problems described above, and a first aspect of the present disclosure is an amplifier that includes an input end to which an input signal is applied; a low-frequency amplifier circuit that includes a first transistor having a gate terminal to which the applied input signal is input, the first transistor being a transistor through which a current depending on the applied input signal flows, a load section that is connected to a drain terminal of the first transistor, a second transistor of which a gate terminal is connected to the load section, the second transistor being a transistor through which a current depending on a change in a voltage of the drain terminal of the first transistor flows, a first resistance to which a source terminal of the first transistor and a drain terminal of the second transistor are connected in common, the first resistance being a resistance through which the current from the first transistor and the current from the second transistor flow, and a third transistor that supplies a current approximately equal to the current of the second transistor; a high-frequency amplifier circuit that includes a constant current circuit, a fourth transistor that is connected in series to the input end and the constant current circuit, the fourth transistor being a transistor through which a bias current from the constant current circuit flows, a first capacitor that is connected in parallel to the constant current circuit and causes an alternating current signal from among the input signal to flow into the fourth transistor, and a fifth transistor that forms a current mirror circuit with the fourth transistor and supplies a current depending on the current flowing through the fourth transistor; and an output end from which the current supplied by the third transistor and the current supplied by the fifth transistor are output.

Further, in the first aspect, a second resistance that is connected to the output end and converts the output current into voltage, may further be included.

Further, in the first aspect, the low-frequency amplifier circuit may further include a second capacitor that is connected between the input end and the gate terminal of the first transistor, and a bias circuit that supplies a bias voltage to the gate terminal of the first transistor.

Further, in the first aspect, the load section may be formed of a constant current circuit.

Further, in the first aspect, the constant current circuit of the high-frequency amplifier circuit may be formed of a current mirror circuit that causes a current depending on the current flowing through the third transistor to flow, and the third transistor may supply the current to the output end via the high-frequency amplifier circuit.

Further, in the first aspect, the low-frequency amplifier circuit may further include a sixth transistor that is connected to the first transistor in a cascode arrangement.

Further, in the first aspect, the low-frequency amplifier circuit may further include a second constant current circuit that supplies a bias current to the first transistor.

The load section is connected to the drain terminal of the first transistor, and the first resistance is connected to the source terminal of the first transistor. An input signal is applied to the gate terminal of the first transistor. A current depending on a change in a voltage of the drain terminal of the first transistor flows through the second transistor since the gate terminal of the second transistor is connected to the load section. The drain terminal of the second transistor is connected to the first resistance, and an output current of the second transistor is fed back in series into the first transistor. Thus, if an offset voltage of the first transistor is ignored, a voltage of the input signal will be approximately equal to a terminal voltage of the first resistance. In other words, what is obtained by dividing the input signal by a resistance value of the first resistance is equal to a current of the drain terminal of the second transistor.

A current equal to the current of the drain terminal of the second transistor is supplied from the third transistor as an output current, and consequently, a ratio of an input voltage to an output current depends on a value of the first resistance. It is expected that a gain is adjusted independently of gm of the first transistor.

Advantageous Effects of Invention

The present disclosure provides an excellent effect of easily adjusting a gain of an amplifier.

MODE(S) FOR CARRYING OUT THE INVENTION

Next, modes for carrying out the present disclosure (hereinafter referred to as embodiments) will be described with reference to the drawings. In the accompanying drawings, the same or similar portions will be denoted by the same or similar reference symbols. However, the figures are schematic ones, and, for example, a ratio of dimensions of respective components is not necessarily the same as the actual one. Further, of course, a certain figure and another figure have different dimensional relationships and different ratios of dimensions with respect to the same portion. Moreover, the embodiments will be described in the following order.

1. First Embodiment
2. Second Embodiment
3. Third Embodiment
4. Fourth Embodiment 1. First Embodiment

[Configuration of Imaging Device]

Figure 1:
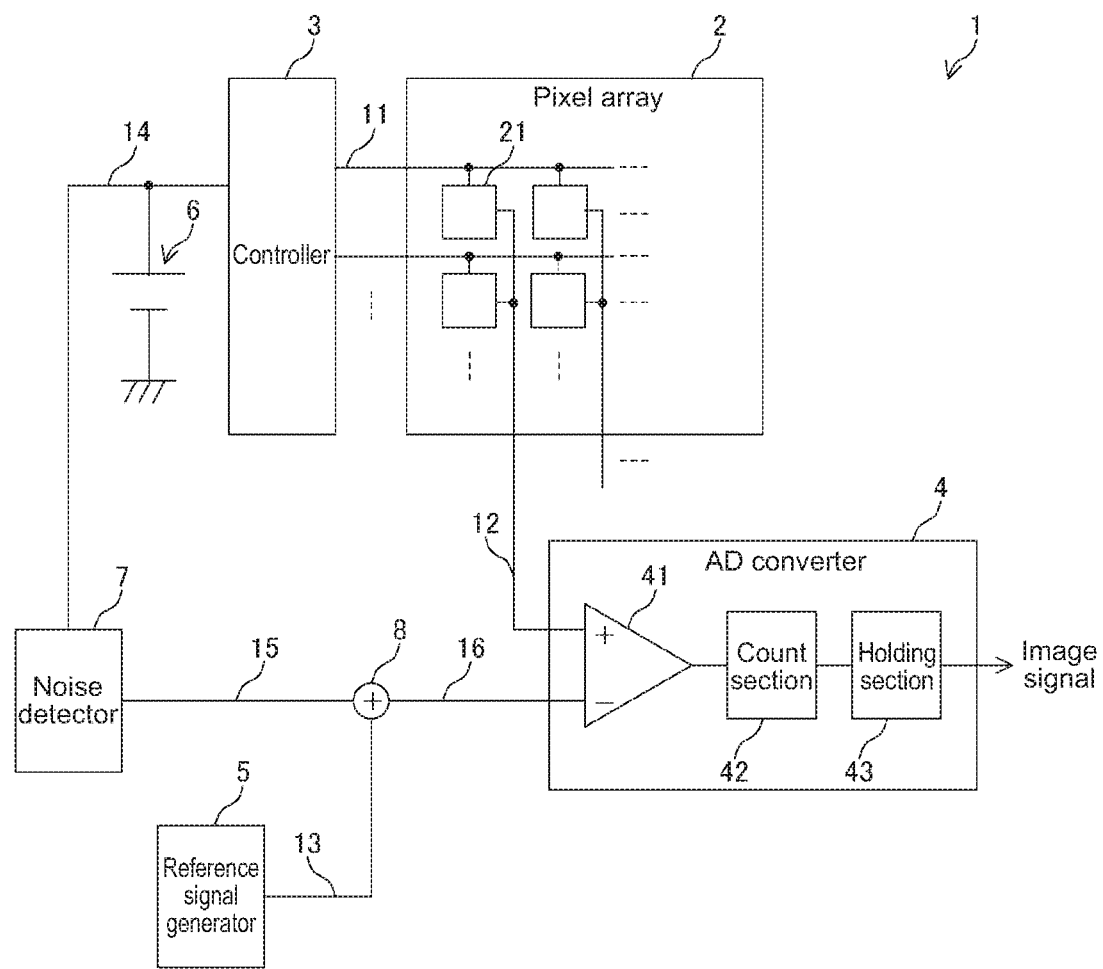
FIG. 1 illustrates a configuration example of an image-capturing apparatus to which the present disclosure may be applied.

FIG. 1 illustrates a configuration example of an image-capturing apparatus to which the present disclosure may be applied. An imaging device 1 in the figure includes a pixel array 2, a controller 3, an analog-to-digital converter (an AD converter) 4, a reference signal generator 5, a power supply 6, a noise detector 7, and an adder 8. Note that an amplifier 100 described later is applied to the noise detector 7.

The pixel array 2 includes pixels 21 arranged in a two-dimensional grid. Here, the pixel 21 generates an image signal depending on irradiated light. The pixel 21 includes a photodiode that performs photoelectric conversion on irradiated light, and a pixel circuit that generates an image signal from a charge generated by the photoelectric conversion. The pixel array 2 includes signal lines 11 and 12 that are arranged in an XY matrix and routed with respect to the pixels 21. The signal line 11 is a signal line that transmits a control signal for the pixel 21. The signal line 11 is arranged for each row of the pixels 21 arranged in the pixel array 2 and routed in common with respect to the pixels 21 arranged in each row. The signal line 12 is a signal line that transmits an image signal generated by the pixel 21. The signal line 12 is arranged for each column of the pixels 21 arranged in the pixel array 2 and routed in common with respect to the pixels 21 arranged in each column. The pixel 21 performs photoelectric conversion on the basis of a control signal from the controller 3 described later, and outputs the generated image signal to the signal line 12.

The controller 3 generates a control signal for the pixel 21. The controller 3 transmits a control signal to each pixel 21 through the signal line 11.

The AD converter 4 performs an AD conversion that converts an analog image signal generated by the pixel 21 into a digital image signal. The AD converter 4 is arranged for each column of the pixel array 2, and is connected to the signal line 12 of the column. The figure illustrates one AD converter 4 as an example. The AD converter 4 includes a comparator 41, a count section 42, and a holding section 43. The comparator 41 compares an analog image signal and a reference signal. Here, the reference signal is a signal serving as a reference for an AD conversion. A signal in which voltage is changed in a ramping manner can be used as the reference signal. The comparator 41 outputs a comparison result to the count section 42. The count section 42 measures the time from a start of comparison performed by the comparator 41 to output of a result of the comparison, and outputs a result of the measurement. The measurement can be performed by counting a clock signal. The holding section 43 holds the result of the measurement performed by the count section 42 as a digital image signal. The holding section 43 outputs the held digital image signal at a specified timing. The output digital image signal is an output signal of the imaging device 1. The AD conversion performed by the AD converter 4 will be described later in detail.

The reference signal generator 5 generates a reference signal. The generated reference signal is supplied to the adder 8 described later through a signal line 13.

The power supply 6 supplies power to the imaging device 1. The power supply 6 supplies power to the controller 3 and the like through a power supply line 14.

The noise detector 7 detects noise of the imaging device 1. The noise detector 7 detects a variation in a power supply voltage of the power supply 6 as noise. As described above, a plurality of pixels 21 is arranged in the pixel array 2, and is driven by a control signal in common. The power supply voltage of the power supply 6 varies due to a load variation being caused at this point. The variation in the power supply voltage results in a change in an analog image signal output from the pixel 21. In other words, noise is superimposed on the image signal. The power supply line 14 is connected to the noise detector 7, and the noise detector 7 detects an amount of variation in the power supply voltage. The detected amount of variation in the power supply voltage is supplied to the adder 8 through a signal line 15.

The adder 8 adds the amount of variation in the power supply voltage that is detected by the noise detector 7 to the reference signal generated by the reference signal generator 5. This results in correcting the reference signal generated by the reference signal generator 5. The corrected reference signal is supplied to the comparator 41 through a signal line 16.

The above-described AD conversion performed on the basis of a corrected reference signal makes it possible to cancel out a change in image signal, and thus to reduce an effect of noise.

[AD Conversion]

Figure 2:
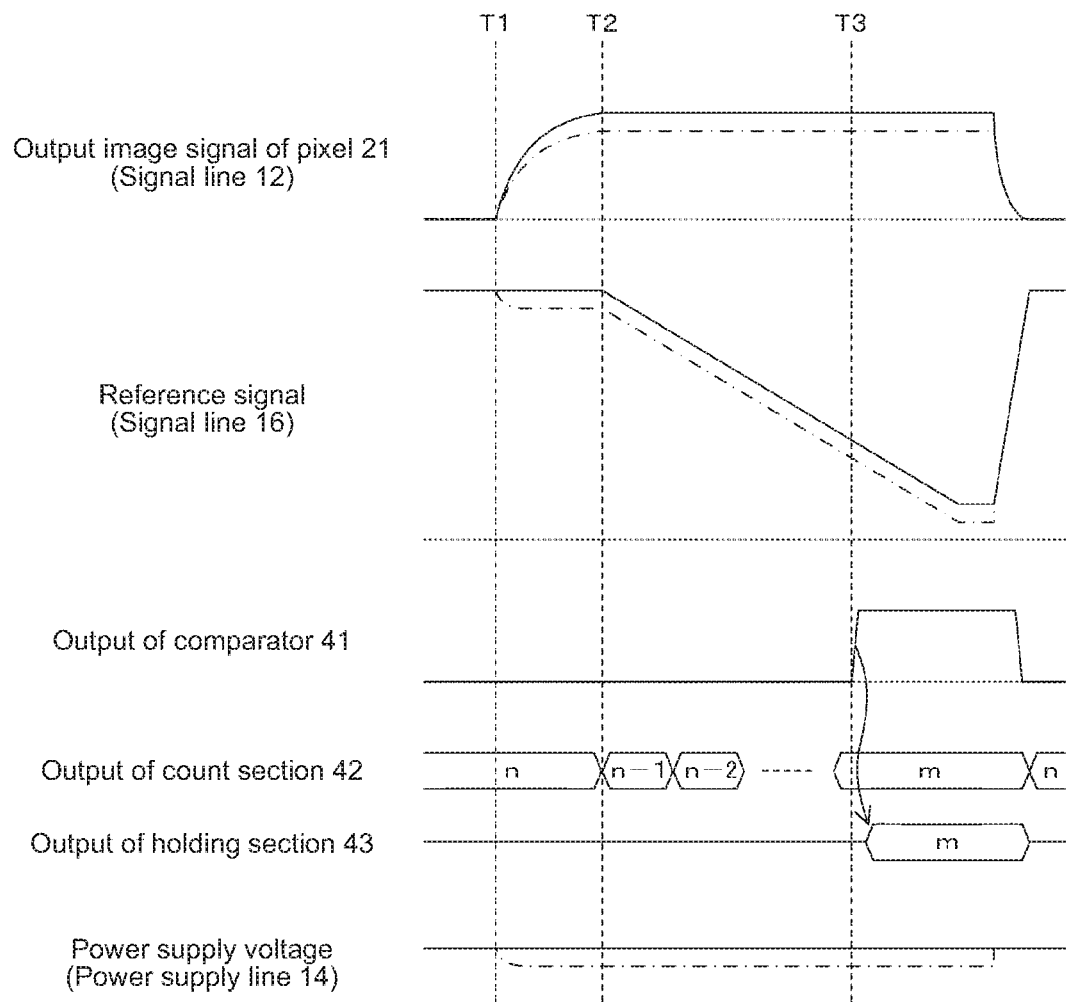
FIG. 2 illustrates an example of an AD conversion according to embodiments of the present disclosure.

FIG. 2 illustrates an example of an AD conversion according to embodiments of the present disclosure. The figure illustrates the AD conversion performed in the imaging device 1 with respect to an image signal described with reference to FIG. 1. In the figure, "Output image signal of pixel 21" represents an analog image signal output from the pixel 21, and represents a signal transmitted through the signal line 12. "Reference signal" represents a reference signal input to the comparator 41, and represents a signal transmitted through the signal line 16. A signal in which voltage is reduced in a ramping manner can be used as the reference signal. "Output of comparator 41" represents an output signal of the comparator 41. "Output of count section 42" represents a digital signal output by the count section 42. "Output of holding section 43" represents a digital signal held and output by the holding section 43. "Power supply voltage" represents a power supply voltage of the power supply 6, and represents a voltage of the power supply line 14.

The AD conversion performed in the imaging device 1 is described. In an initial state, the reference signal generator 5 outputs a maximum voltage, and the comparator 41 outputs logic "0". The count section 42 is initialized such that the value exhibits "n". First, at T1, output of an analog image signal from the pixel 21 is started due to control performed by the controller 3. After the elapse of a specified settling time, at T2, output of a reference signal is started, and comparison of the analog image signal and the reference signal that is performed by the comparator 41 is started. Further, counting (down count) performed by the count section 42 is started. As illustrated in the figure, when an AD conversion is started, a voltage of the reference signal is higher than a voltage of the analog image signal. Thus, the comparator 41 outputs the value "0".

Next, at T3, when the voltage of the reference signal is lower than the voltage of the analog image signal, the output of the comparator 41 is changed to the value "1". In other words, a result of the comparison is output. In response to this, the count section 42 stops performing counting, and outputs a count value to the holding section 43. As described above, the count section 42 measures the time from a start of an AD conversion to output of a result of comparison performed by the comparator 41. Since a measured time is proportional to a voltage of an image signal, it is possible to perform an AD conversion by outputting a digital signal corresponding to the measured time. Specifically, a complement of a digital signal held in the holding section 43 can be used for a digital image signal.

When there is a reduction in the power supply voltage as indicated by the dot-dash line in the figure, there is also a reduction in the output image signal of the pixel 21 as indicated by the dot-dash line. In this case, it is possible to eliminate an effect of the reduction on a result of comparison performed by the comparator 41, by similarly reducing a voltage of the reference signal. As described above, the adjustment of a reference signal depending on a variation in power supply voltage makes it possible to reduce an effect of the variation in power supply voltage (noise).

[Configuration of Amplifier]

Figure 3:
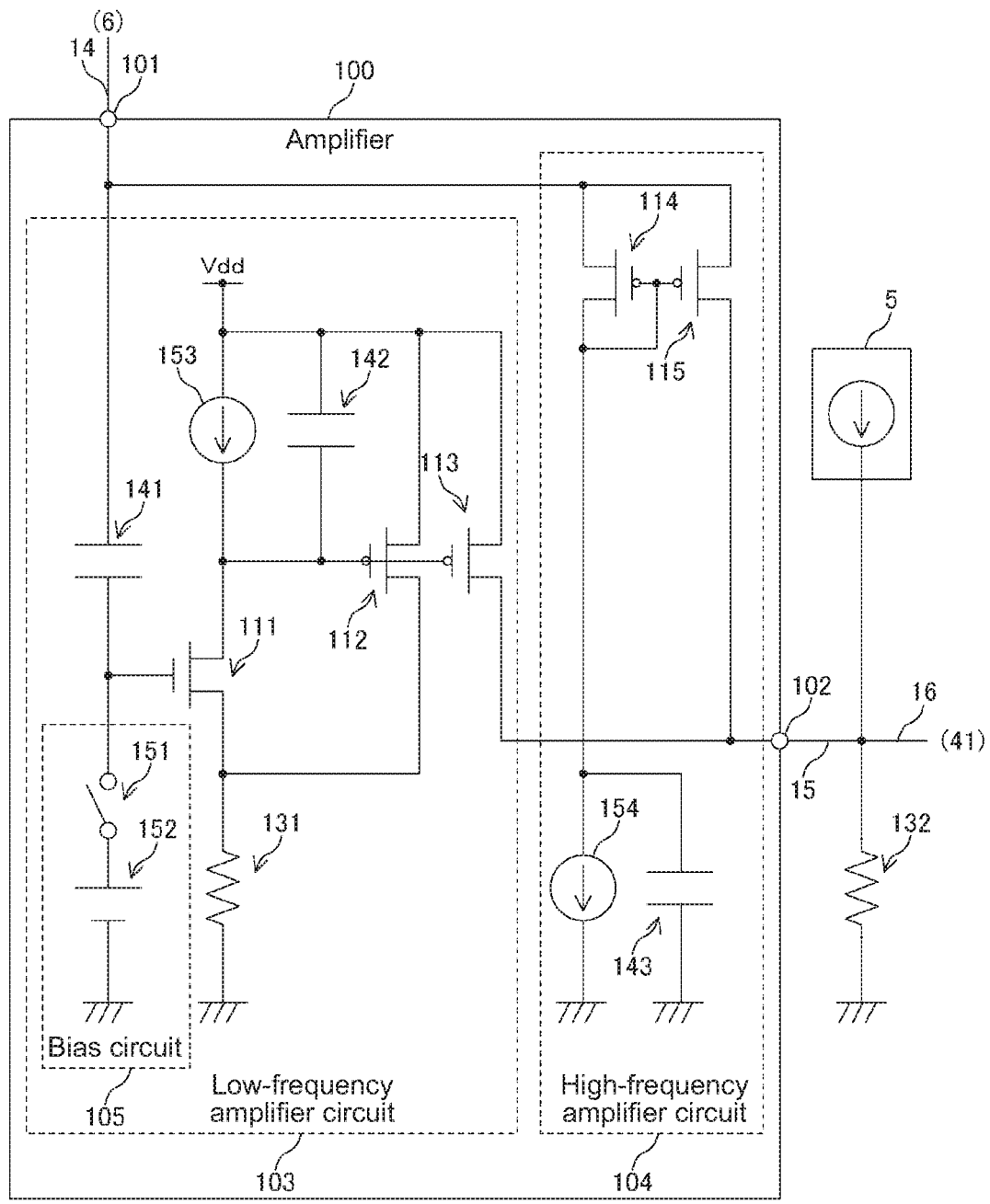
FIG. 3 is a circuit diagram illustrating a configuration example of an amplifier according to a first embodiment of the present disclosure.

FIG. 3 is a circuit diagram illustrating a configuration example of an amplifier according to a first embodiment of the present disclosure. The amplifier 100 in the figure includes an input end 101, a low-frequency amplifier circuit 103, a high-frequency amplifier circuit 104, an output end 102, and a resistance 132.

The input end 101 is a terminal to which an input signal is applied. The power supply line 14 is connected to the input end 101, and the power supply voltage from the power supply 6 is applied to the input end 101.

The low-frequency amplifier circuit 103 is a circuit that primarily amplifies a low-frequency signal component from among the input signal from the input end 101. The low-frequency amplifier circuit 103 amplifies a voltage of the input signal, converts the voltage into current, and outputs the current to the output end 102.

The high-frequency amplifier circuit 104 is a circuit that amplifies a high-frequency signal component from among the input signal from the input end 101. As in the case of the low-frequency amplifier circuit 103, the high-frequency amplifier circuit 104 also amplifies the input signal and then converts the input signal into current, and outputs the current to the output end 102.

The output end 102 is an output terminal of the amplifier 100. The output end 102 is supplied with an output current of the low-frequency amplifier circuit 103 and an output current of the high-frequency amplifier circuit 104. Further, the signal line 15 is connected to the output end 102.

The resistance 132 is a resistance that converts current output from the output end 102 into voltage. An end of the resistance 132 is connected to the output end 102, and the other end is grounded. The current from the low-frequency amplifier circuit 103 and the current from the high-frequency amplifier circuit 104 flow through the resistance 132 in common. Thus, the low-frequency amplifier circuit 103 and the high-frequency amplifier circuit 104 are connected in parallel between the input end 101 and the output end 102.

The figure further illustrates the reference signal generator 5 described with reference to FIG. 1. The reference signal generator 5 includes a current source that supplies current to the resistance 132, and is capable of outputting, to the signal line 15, a reference signal in which voltage is changed in a ramping manner, by changing the current supplied to the resistance 132 in a ramping manner. Further, the reference signal and an amount of variation in power supply voltage that is detected by the amplifier 100 are added in the resistance 132 since the output current of the amplifier 100 further flows through the resistance 132, as described above. The resistance 132 forms the adder 8 described with reference to FIG. 1.

The low-frequency amplifier circuit 103 includes MOS transistors 111 to 113, a resistance 131, capacitors 141 and 142, a constant current circuit 153, and a bias circuit 105. An re-channel MOS transistor may be used as the MOS transistor 111. A p-channel MOS transistor may be used as the MOS transistors 112 and 113. A gate terminal, a drain terminal, and a source terminal of the MOS transistor are hereinafter respectively abbreviated as a gate, a drain, and a source. The bias circuit 105 includes a switch 151 and a voltage source 152. Further, a power supply line Vdd is arranged in the low-frequency amplifier circuit 103. The low-frequency amplifier circuit 103 is supplied with power by the power supply line Vdd being connected to a power supply different from the power supply 6 described with reference to FIG. 1. Note that the power supply line Vdd may be connected to the input end 101 to supply power to the low-frequency amplifier circuit 103 from the power supply 6 of FIG. 1.

Note that the MOS transistor 111 is an example of a first transistor according to an embodiment of the present disclosure. The MOS transistor 112 is an example of a second transistor according to an embodiment of the present disclosure. The MOS transistor 113 is an example of a third transistor according to an embodiment of the present disclosure. The constant current circuit 153 is an example of a load section according to an embodiment of the present disclosure. The resistance 131 is an example of a first resistance according to an embodiment of the present disclosure. The resistance 132 is an example of a second resistance according to an embodiment of the present disclosure.

An end of the capacitor 141 is connected to the input end 101, and the other end is connected to the gate of the MOS transistor 111 and an end of the switch 151. The voltage source 152 is connected to the other end of the switch 151. The source of the MOS transistor 111 is connected to the drain of the MOS transistor 112 and an end of the resistance 131. The other end of the resistance 131 is grounded. The constant current circuit 153 and the capacitor 142 being connected in parallel are connected between the power supply line Vdd and the drain of the MOS transistor 111. The gate of the MOS transistor 112 and the gate of the MOS transistor 113 are further connected to the drain of the MOS transistor 111. The sources of the MOS transistor 112 and the MOS transistor 113 are connected in common to the power supply line Vdd. The drain of the MOS transistor 113 is connected to the output end 102.

The capacitor 141 is a coupling capacitor that connects the MOS transistor 111 to the input end 101. The capacitor 141 transmits an alternating current signal from among an input signal to the gate of the MOS transistor 111.

The MOS transistor 111 is a transistor that amplifies an input signal. Power is supplied to the drain of the MOS transistor 111 through the constant current circuit 153, and the resistance 131 is connected to the source of the MOS transistor 111. A drain current corresponding to an input signal input by the capacitor 141 flows through the MOS transistor 111.

The constant current circuit 153 supplies a specified current to the MOS transistor 111. Further, the constant current circuit 153 operates as a load for the MOS transistor 111. The capacitor 142 is connected in parallel to the constant current circuit 153. The capacitor 142 is a capacitor that decreases load impedance of the MOS transistor 111 in a high-frequency range to limit a frequency range of the low-frequency amplifier circuit 103 in the high-frequency range.

The bias circuit 105 is a circuit that supplies a bias voltage to the gate of the MOS transistor 111. As described above, the bias circuit 105 includes the switch 151 and the voltage source 152. The voltage source 152 is a voltage source that supplies a bias voltage for the MOS transistor 111. Due to a bias voltage supplied by the voltage source 152, a drain current approximately equal to an output current of the constant current circuit 153 flows through the MOS transistor 111. The switch 151 is a switch that applies a bias voltage from the voltage source 152 to the gate of the MOS transistor 111. The bias voltage is charged up to the input capacitances (Cgs) of the capacitor 141 and the MOS transistor 111 when the switch 151 is in a conductive state. Thereafter, the switch 151 is brought to a non-conductive state, and this makes it possible to increase the input impedance of the low-frequency amplifier circuit 103. A bias voltage may normally be charged up to Cgs, with the switch 151 being in a conductive state, and the switch 151 may be brought to a non-conductive state when a detection of noise (such as the variation in power supply voltage described with reference to FIG. 2) is performed. It is possible to obtain the amplifier 100 of a high input impedance when noise detection is performed, and thus to reduce an error.

Note that the configuration of the bias circuit 105 is not limited to this example. For example, a resistance having a relatively high resistance value may be used instead of the switch 151.

The MOS transistor 112 is a transistor of which the gate is connected to the constant current circuit 153 forming a load of the drain of the MOS transistor 111, and is a transistor through which a drain current corresponding to a drain voltage of the MOS transistor 111 flows. The drain current of the MOS transistor 112 is supplied to the resistance 131 connected to the source of the MOS transistor 111. In other words, the MOS transistor 112 amplifies a change in the drain voltage of the MOS transistor 111, converts the change in the drain voltage of the MOS transistor 111 into a change in current, and feeds it back into the source of the MOS transistor 111. Thus, a voltage Vgs between the gate and the source of the MOS transistor 111 is maintained at a substantially constant voltage, and it is possible to reduce an apparent input capacitance of the MOS transistor. This makes it possible to reduce the capacitance of the capacitor 141, and thus to reduce a footprint of the amplifier 100.

The MOS transistor 113 is a transistor that supplies current to the output end 102. The gate of the MOS transistor 113 is connected to the gate of the MOS transistor 112, and the source of the MOS transistor 113 is connected to the power supply line Vdd as in the case of the MOS transistor 112. Due to the MOS transistors 112 and 113 having the same characteristics, the MOS transistor 113 can supply substantially the same drain current as the drain current of the MOS transistor 112.

The drain current of the MOS transistor 113 flows through the resistance 132 via the output end 102, and is converted into an output voltage. As described above, the drain current of the MOS transistor 113 is approximately equal to the drain current of the MOS transistor 112. Thus, a change (ΔVo) in an output voltage Vo of the low-frequency amplifier circuit 103 can be represented by the following formula.

$$\Delta Vo = \Delta Io \times R132 = \Delta Is \times R132$$

Here, ΔIo and ΔIs respectively represent a change in output current and a change in a source current of the MOS transistor 111. Further, R132 represents a resistance value of the resistance 132.

On the other hand, a change (ΔVi) in an input voltage Vi of the low-frequency amplifier circuit 103 can be represented by the following formula.

$$\Delta Vi = \Delta Is \times R131$$

Here, R131 represents a resistance value of the resistance 131. A gain G of the low-frequency amplifier circuit 103 can be represented by the following formula.

$$G = \Delta Vo/\Delta Vi = R132/R131$$

In other words, the gain of the low-frequency amplifier circuit 103 is determined by a ratio between the resistances 131 and 132. It is possible to easily adjust a gain of the low-frequency amplifier circuit 103 according to the level of an input signal, that is, the voltage of detected noise. Further, it is possible to reduce a variation in a gain of the low-frequency amplifier circuit 103 since the gain does not depend on gm of the MOS transistor 111.

Note that the gain can also be adjusted by adjusting a gm ratio between the MOS transistors 112 and 113. The reason is that a drain current corresponding to the gm ratio between the MOS transistors 112 and 113 flows through the MOS transistor 113 as an output current since the same gate voltage is applied to the MOS transistors 112 and 113. When the resistance 132 is omitted and a current-output-type amplifier is used as the amplifier 100, the gain can be favorably adjusted by adjusting the gm ratio between the MOS transistors 112 and 113.

The high-frequency amplifier circuit 104 includes MOS transistors 114 and 115, a constant current circuit 154, and a capacitor 143. A p-channel MOS transistor may be used as the MOS transistors 114 and 115.

The sources of the MOS transistor 114 and the MOS transistor 115 are connected in common to the input end 101. The constant current circuit 154 and the capacitor 143 being connected in parallel are connected between the drain of the MOS transistor 114 and the ground. The gate of the MOS transistor 114 and the gate of the MOS transistor 115 are further connected to the drain of the MOS transistor 114. The drain of the MOS transistor 115 is connected to the output end 102.

Note that the MOS transistor 114 is an example of a fourth transistor according to an embodiment of the present disclosure. The MOS transistor 115 is an example of a fifth transistor according to an embodiment of the present disclosure. The capacitor 143 is an example of a first capacitor according to an embodiment of the present disclosure.

The constant current circuit 154 is a circuit that causes a specified current to flow into the drain of the MOS transistor 114. The constant current circuit 154 causes a specified bias current to flow into the MOS transistor 114 from the input end 101.

The capacitor 143 is a capacitor that causes the constant current circuit 154 to be bypassed with respect to an alternating current signal from among an input signal. An alternating current signal of an input signal further flows through the MOS transistor 114 by connecting the capacitor 143 to the drain of the MOS transistor 114.

The MOS transistor 115 is a transistor of which the drain is connected to the output end 102, and is a transistor that forms a current mirror with the MOS transistor 114. A drain current having substantially the same value as that of the MOS transistor 114 flows through the MOS transistor 115. In other words, current substantially equivalent to an alternating current signal flowing through the MOS transistor 114 via the capacitor 143 also flows through the MOS transistor 115. The alternating current signal is supplied to the output end 102. This enables the high-frequency amplifier circuit 104 to detect, from an input signal, a signal of a frequency corresponding to the capacitance of the capacitor 143, and to output the detected signal. The selection of the capacitance of the capacitor 143 makes it possible to easily adjust a frequency range of the high-frequency amplifier circuit 104. Further, it is possible to separate the capacitance of the capacitor 143 from the capacitance of the output end 102 of the high-frequency amplifier circuit 104 since the capacitor 143 is connected to a node other than the output end 102. It is possible to reduce the capacitance as viewed from the output side of the high-frequency amplifier circuit 104, and thus to reduce the settling time of a reference signal generated by the reference signal generator 5. It is possible to generate a reference signal with a high degree of accuracy.

Further, a change in a mirror ratio of the current mirror makes it possible to adjust the gain of the high-frequency amplifier circuit 104. For example, it is possible to increase current supplied to the output end 102, by connecting a MOS transistor in parallel to the MOS transistor 115 of a mirror destination, and thus to obtain a gain having a value greater than one.

[Frequency Characteristics of Amplifier]

Figure 4:
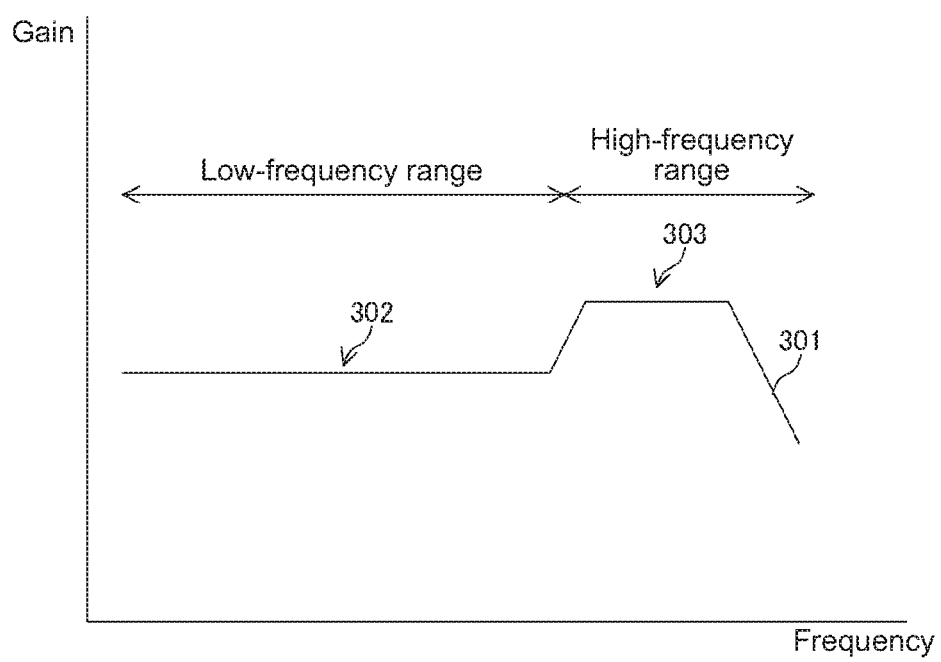
FIG. 4 illustrates an example of characteristics of the amplifier according to the first embodiment of the present disclosure.

FIG. 4 illustrates an example of characteristics of the amplifier according to the first embodiment of the present disclosure. The figure illustrates frequency characteristics of the amplifier 100. The horizontal and vertical axes in the figure respectively represent a frequency and a gain. A graph 301 in the figure is a graph that indicates characteristics of the amplifier 100. A low-frequency range in the figure is primarily a range in which the low-frequency amplifier circuit 103 amplifies an input signal, and a high-frequency range in the figure is primarily a range in which the high-frequency amplifier circuit 104 amplifies an input signal. It is possible to adjust a gain 302 of the amplifier 100 in the low-frequency range in the figure by adjusting the ratio between the resistances 131 and 132 or the gm ratio between the MOS transistors 112 and 113 described with reference to FIG. 3. Further, it is possible to adjust a gain 303 in the high-frequency range in the figure by changing the mirror ratio between the MOS transistors 115 and 114 described with reference to FIG. 3. It is possible to change crossover frequencies in the high-frequency range and the low-frequency range by adjusting the capacitances of the capacitors 142 and 143 of FIG. 3.

For example, when the capacitor 142 is omitted in the low-frequency amplifier circuit 103, it is possible to obtain the characteristics in which the gain 302 of the low-frequency amplifier circuit 103 extends up to the high-frequency range.

Note that the configuration of the amplifier 100 is not limited to this example. For example, the low-frequency amplifier circuit 103 or the high-frequency amplifier circuit 104 may be omitted.

As described above, the amplifier 100 of the first embodiment of the present disclosure makes it possible to adjust a gain in the low-frequency range by changing a ratio between the resistances 131 and 132 or a gm ratio between the MOS transistors 112 and 113. Further, it is possible to adjust a gain in the high-frequency range by changing a mirror ratio between the MOS transistors 114 and 115. This makes it possible to easily adjust a gain according to detected noise, and thus to reduce an effect of noise on an image signal.

2. Second Embodiment

In the amplifier 100 of the first embodiment described above, the low-frequency amplifier circuit 103 and the high-frequency amplifier circuit 104 are connected in parallel. On the other hand, the amplifier 100 of a second embodiment of the present disclosure is different from the first embodiment described above in that the low-frequency amplifier circuit 103 and the high-frequency amplifier circuit 104 are connected to each other in a cascade arrangement.

[Configuration of Amplifier]

Figure 5:
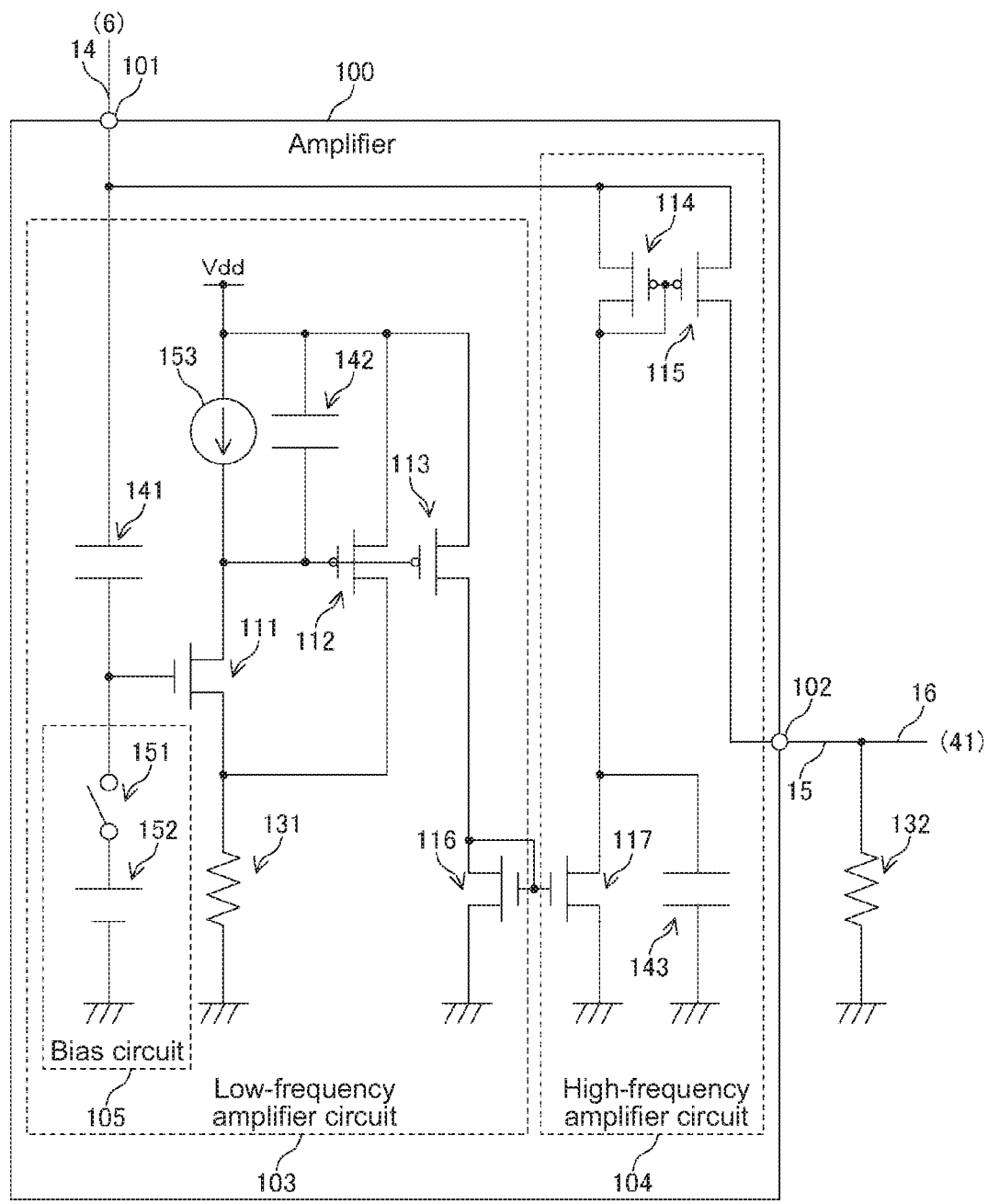
FIG. 5 is a circuit diagram illustrating a configuration example of an amplifier according to a second embodiment of the present disclosure.

FIG. 5 is a circuit diagram illustrating a configuration example of an amplifier according to the second embodiment of the present disclosure. The amplifier 100 in the figure is different from the amplifier 100 described with reference to FIG. 3 in that a MOS transistor 117 is arranged instead of the constant current circuit 154 and a MOS transistor 116 is further included. An n-channel MOS transistor may be used as the MOS transistors 116 and 117.

The drain of the MOS transistor 113 is connected to the drain and the gate of the MOS transistor 116 and to the gate of the MOS transistor 117. The sources of the MOS transistors 116 and 117 are grounded. The drain of the MOS transistor 117 is connected to an end of the capacitor 143, to the drain and the gate of the MOS transistor 114, and to the gate of the MOS transistor 115. With respect to the other elements, connection is similar to the connection established in the amplifier 100 described with reference to FIG. 3. Thus, the description is omitted.

The MOS transistors 116 and 117 form a current mirror circuit. Current supplied by the MOS transistor 113 flows through the MOS transistor 116, and the same current further flows through the MOS transistor 117. In other words, an output current of the low-frequency amplifier circuit 103 is a bias current of the MOS transistor 114 of the high-frequency amplifier circuit 104. Accordingly, an output of the low-frequency amplifier circuit 103 is transmitted to the high-frequency amplifier circuit 104, and the low-frequency amplifier circuit 103 and the high-frequency amplifier circuit 104 are connected to each other in a cascade arrangement. The use of an output current of the low-frequency amplifier circuit 103 as a bias current of the MOS transistor 114 of the high-frequency amplifier circuit 104 makes it possible to reduce current consumed by the amplifier 100. Further, it is possible to increase a resistance value of the resistance 132 since only an output current of the high-frequency amplifier circuit 104 is supplied to the resistance 132. Thus, it is possible to reduce an output current of the reference signal generator 5.

Note that the current mirror circuit formed of the MOS transistors 116 and 117 is an example of a current mirror circuit according to an embodiment of the present disclosure.

Except for the points described above, the amplifier 100 has a configuration similar to the configuration of the amplifier 100 described in the first embodiment of the present disclosure. Thus, the description is omitted.

As described above, the amplifier 100 of the second embodiment of the present disclosure reduces an output current by the low-frequency amplifier circuit 103 and the high-frequency amplifier circuit 104 being connected to each other in a cascade arrangement. This makes it possible to reduce the power consumption of the amplifier 100.

3. Third Embodiment

The amplifier 100 of the first embodiment described above only uses the MOS transistor 111 in the first stage of the low-frequency amplifier circuit 103. On the other hand, the amplifier 100 of a third embodiment of the present disclosure is different from the first embodiment described above in using a circuit obtained by combining a plurality of MOS transistors.

[Configuration of Amplifier]

Figure 6:
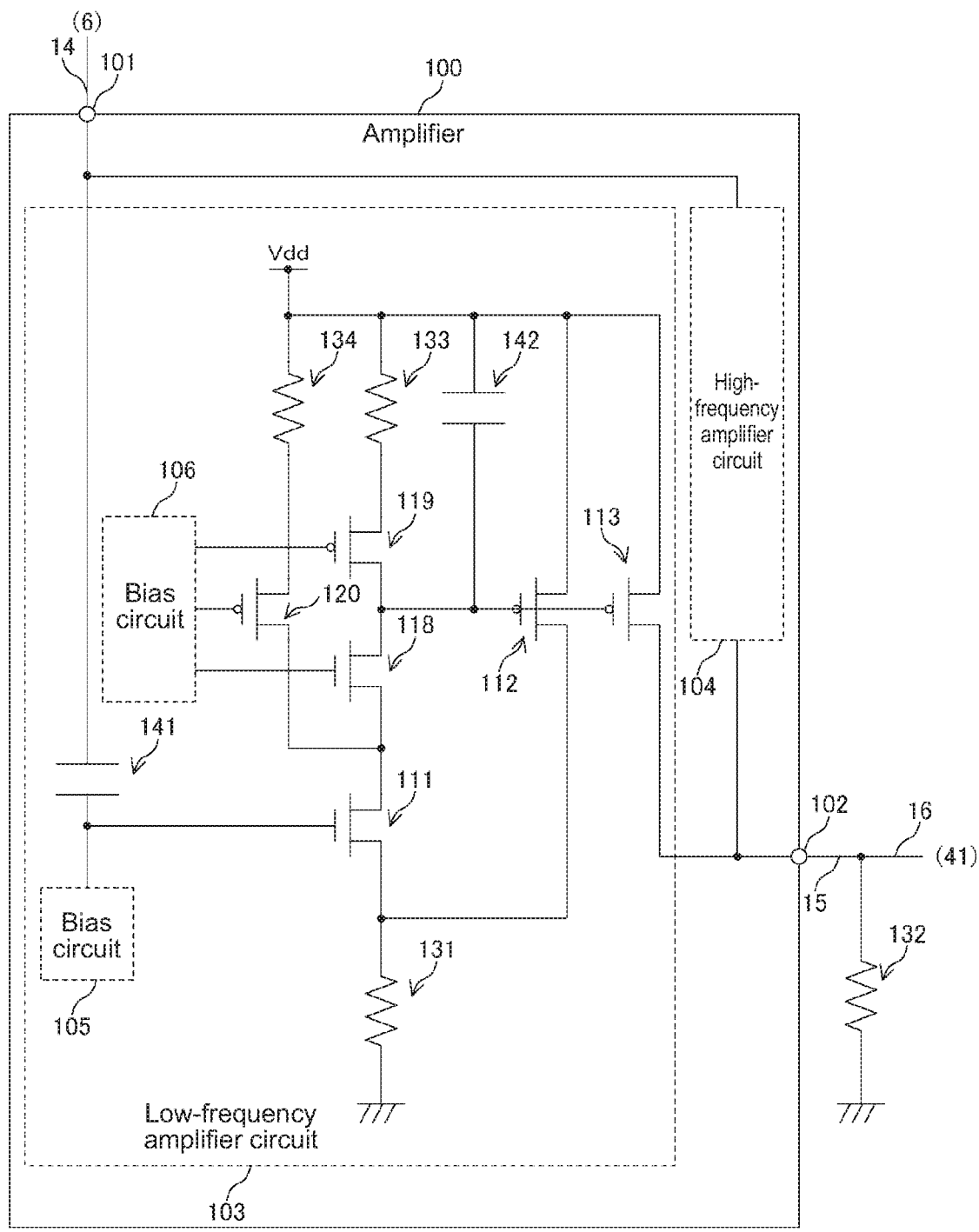
FIG. 6 is a circuit diagram illustrating a configuration example of an amplifier according to a third embodiment of the present disclosure.

FIG. 6 is a circuit diagram illustrating a configuration example of an amplifier according to the third embodiment of the present disclosure. The amplifier 100 in the figure is different from the amplifier 100 described with reference to FIG. 3 in further including MOS transistors 118 to 120 and a bias circuit 106. A p-channel MOS transistor may be used as the MOS transistors 119 and 120. An n-channel MOS transistor may be used as the MOS transistor 118. Note that the bias circuit 105 and the high-frequency amplifier circuit 104 are abbreviated.

The drain of the MOS transistor 111 is connected to the source of the MOS transistor 118 and the drain of the MOS transistor 120. The drain of the MOS transistor 118 is connected to the drain of the MOS transistor 119, the gate of MOS transistor 112, the gate of the MOS transistor 113, and an end of the capacitor 142. The source of the MOS transistor 119 is connected to an end of the resistance 133, and the other end of the resistance 133 is connected to the power supply line Vdd. The source of the MOS transistor 120 is connected to an end of a resistance 134, and the other end of the resistance 134 is connected to the power supply line Vdd. Further, the gates of the MOS transistors 118 to 120 are each connected to the bias circuit 106. With respect to the other elements, connection is similar to the connection established in the amplifier 100 described with reference to FIG. 3. Thus, the description is omitted.

The bias circuit 106 is a circuit that supplies a bias voltage to the gates of the MOS transistors 118 to 120.

The MOS transistor 118 is a transistor that is connected to the MOS transistor 111 in a cascode arrangement. It is possible to reduce the input capacitance of the MOS transistor 111 by connecting the MOS transistor 118 to the drain of the MOS transistor 111, and thus to reduce the capacitance of the capacitor 141.

Further, the MOS transistor 119 and the resistance 133 being connected in series and the bias circuit 106 represent a specific configuration of the constant current circuit 153 described with reference to FIG. 3. This constant current circuit adjusts its own internal resistance such that a specified current flows. Specifically, the adjustment of an internal resistance of the MOS transistor 119 results in adjusting voltage applied to the MOS transistor 111 and in keeping current flowing through the MOS transistor 111 constant. It is possible to reduce apparent gm of the MOS transistor 119 by a resistance (the resistance 133) being connected in series to the source of the MOS transistor 119 forming such a constant current circuit. This results in being able to reduce noise.

On the other hand, there is a possibility that current supplied to the MOS transistor 111 will become insufficient when a power supply voltage of the power supply line Vdd is low, since the MOS transistors 119, 118, and 111 are connected in series. Thus, the MOS transistor 120 and the resistance 134 being connected in series are added to supply a constant current to the drain of the MOS transistor 111. In other words, current is supplied to the MOS transistor 111 by bypassing the MOS transistor 118 and the like being connected in a cascode arrangement. This makes it possible to make up for a shortage of supply current for the MOS transistor 111. It is possible to increase resistance values of the resistances 133 and 134, and thus to reduce noise.

Note that the MOS transistor 120 and the resistance 134 being connected in series are an example of a second constant current circuit according to an embodiment of the present disclosure.

Except for the points described above, the amplifier 100 has a configuration similar to the configuration of the amplifier 100 described in the first embodiment of the present disclosure. Thus, the description is omitted.

As described above, the amplifier 100 of the third embodiment of the present disclosure makes it possible to reduce the input capacitance by arranging the MOS transistor 118 connected in a cascode arrangement. This makes it possible to reduce the capacitance of the capacitor 141. Further, it is possible to reduce noise by further arranging a constant current circuit.

4. Fourth Embodiment

The amplifier 100 of the first embodiment described above uses the MOS transistors 112 and 113 being connected in parallel. On the other hand, the amplifier 100 according to a fourth embodiment of the present disclosure is different from the first embodiment in adding a current mirror.

[Configuration of Amplifier]

Figure 7:
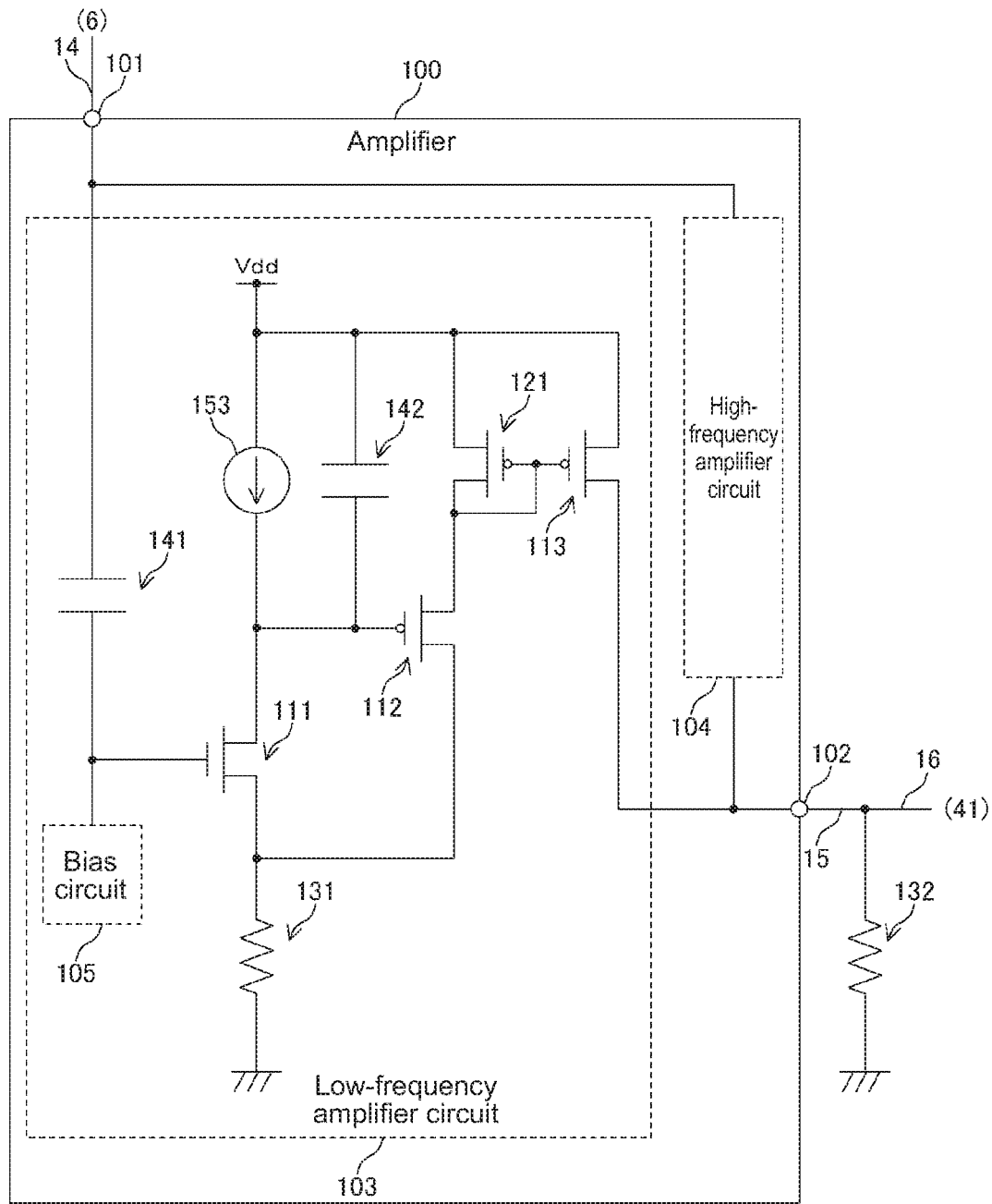
FIG. 7 is a circuit diagram illustrating a configuration example of an amplifier according to a fourth embodiment of the present disclosure.

FIG. 7 is a circuit diagram illustrating a configuration example of an amplifier according to the fourth embodiment of the present disclosure. The amplifier 100 in the figure is different from the amplifier 100 described with reference to FIG. 3 in further including a MOS transistor 121. A p-channel MOS transistor may be used as the MOS transistor 121.

The source of the MOS transistor 112 is connected to the drain and the gate of the MOS transistor 121, and to the gate of the MOS transistor 113. The source of the MOS transistor 121 is connected to the power supply line Vdd. With respect to the other elements, connection is similar to the connection established in the amplifier 100 described with reference to FIG. 3. Thus, the description is omitted.

The MOS transistor 121 is connected in series to the MOS transistor 112, and the MOS transistors 121 and 113 are connected in a current-mirror arrangement. This makes it possible to cause substantially the same drain current as the drain current of the MOS transistor 112 to flow through the MOS transistor 113. It is possible to easily adjust a gain when there is a great variation in gm of between the MOS transistors 112 and 113, such as when they are produced by different production processes.

Except for the points described above, the amplifier 100 has a configuration similar to the configuration of the amplifier 100 described in the first embodiment of the present disclosure. Thus, the description is omitted.

As described above, the amplifier 100 of the fourth embodiment of the present disclosure makes it possible to adjust a gain using a circuit that uses a current mirror.

Finally, the descriptions of the respective embodiments above are examples of the present disclosure, and the present disclosure is not limited to the embodiments described above. Thus, various modifications may of course be made depending on the design and the like without departing from the technical idea according to the present disclosure even in the case of an embodiment other than the embodiments described above.

Note that the present technology may also take the following configurations.

(1) An amplifier, including:
  an input end to which an input signal is applied;
  a low-frequency amplifier circuit that includes
    a first transistor having a gate terminal to which the applied input signal is input, the first transistor being a transistor through which a current depending on the applied input signal flows,
    a load section that is connected to a drain terminal of the first transistor,
    a second transistor of which a gate terminal is connected to the load section, the second transistor being a transistor through which a current depending on a change in a voltage of the drain terminal of the first transistor flows,
    a first resistance to which a source terminal of the first transistor and a drain terminal of the second transistor are connected in common, the first resistance being a resistance through which the current from the first transistor and the current from the second transistor flow, and
    a third transistor that supplies a current approximately equal to the current of the second transistor;
  a high-frequency amplifier circuit that includes
    a constant current circuit,
    a fourth transistor that is connected in series to the input end and the constant current circuit, the fourth transistor being a transistor through which a bias current from the constant current circuit flows,
    a first capacitor that is connected in parallel to the constant current circuit and causes an alternating current signal from among the input signal to flow into the fourth transistor, and
    a fifth transistor that forms a current mirror circuit with the fourth transistor and supplies a current depending on the current flowing through the fourth transistor; and
  an output end from which the current supplied by the third transistor and the current supplied by the fifth transistor are output.

(2) The amplifier according to (1), further including
  a second resistance that is connected to the output end and converts the output current into voltage.

(3) The amplifier according to (1) or (2), in which
  the low-frequency amplifier circuit further includes
    a second capacitor that is connected between the input end and the gate terminal of the first transistor, and
    a bias circuit that supplies a bias voltage to the gate terminal of the first transistor.

(4) The amplifier according to any one of (1) to (3), in which
  the load section is formed of a constant current circuit.

(5) The amplifier according to any one of (1) to (4), in which
  the constant current circuit of the high-frequency amplifier circuit is formed of a current mirror circuit that causes a current depending on the current flowing through the third transistor to flow, and
  the third transistor supplies the current to the output end via the high-frequency amplifier circuit.

(6) The amplifier according to any one of (1) to (5), in which
  the low-frequency amplifier circuit further includes a sixth transistor that is connected to the first transistor in a cascode arrangement.

(7) The amplifier according to (6), in which
the low-frequency amplifier circuit further includes a second constant current circuit that supplies a bias current to the first transistor.

REFERENCE SIGNS LIST 100 amplifier
101 input end
102 output end
103 low-frequency amplifier circuit
104 high-frequency amplifier circuit
105, 106 bias circuit
111 to 121 MOS transistor
131 to 134 resistance
141 to 143 capacitor
151 switch
152 voltage source
153, 154 constant current circuit

The invention claimed is:

1. An amplifier, comprising:
an input end configured to receive an input signal;
a low-frequency amplifier circuit that includes:
   a first transistor that includes a source terminal, a drain terminal, and a gate terminal, wherein
      the gate terminal is configured to receive the input signal from the input end, and
      a first current that flows through the first transistor is based on the input signal received by the gate terminal;
   a load section connected to the drain terminal of the first transistor;
   a second transistor that includes a drain terminal and a gate terminal, wherein
      the gate terminal of the second transistor is connected to the load section, and
      a second current that flows through the second transistor is based on a change in a first voltage of the drain terminal of the first transistor;
   a first resistance connected to each of the source terminal of the first transistor and the drain terminal of the second transistor at one end of the first resistance, wherein
      the first current from the first transistor and the second current from the second transistor flow through the first resistance; and
   a third transistor configured to supply a third current substantially equal to the second current of the second transistor;
a high-frequency amplifier circuit that includes:
   a first constant current circuit;
   a fourth transistor connected in series to the input end and the first constant current circuit, wherein a first bias current from the first constant current circuit flows through the fourth transistor;
   a first capacitor connected in parallel to the first constant current circuit, wherein the first capacitor is configured to control an alternating current signal of the input signal to flow into the fourth transistor; and
   a first current mirror circuit that includes a fifth transistor and the fourth transistor, wherein the fifth transistor is configured to supply a fourth current based on the first bias current that flows through the fourth transistor; and
an output end configured to output the third current of the third transistor and the fourth current of the fifth transistor.

2. The amplifier according to claim 1, further comprising a second resistance connected to the output end, wherein the second resistance is configured to convert the output current from the output end into a second voltage.

3. The amplifier according to claim 1, wherein the low-frequency amplifier circuit further includes:
   a second capacitor connected between the input end and the gate terminal of the first transistor; and
   a bias circuit configured to supply a bias voltage to the gate terminal of the first transistor.

4. The amplifier according to claim 1, wherein the load section includes a second constant current circuit.

5. The amplifier according to claim 1, wherein
the first constant current includes a second current mirror circuit,
the second current mirror circuit is configured to control a flow of a fifth current based on the third current that flows through the third transistor, and
the third transistor is further configured to supply the third current to the output end via the high-frequency amplifier circuit.

6. The amplifier according to claim 1, wherein the low-frequency amplifier circuit further includes a sixth transistor connected to the first transistor in a cascode arrangement.

7. The amplifier according to claim 6, wherein
the low-frequency amplifier circuit further includes a second constant current circuit, and
the second constant current circuit is configured to supply a second bias current to the first transistor.

* * * * *